United States Patent
Pujari et al.

(10) Patent No.: US 9,566,668 B2
(45) Date of Patent: Feb. 14, 2017

(54) FLUX FORMULATIONS

(71) Applicant: ALPHA METALS, INC., South Plainfield, NJ (US)

(72) Inventors: Narahari Pujari, Bangalore (IN); Sanyogita Arora, Berkeley Heights, NJ (US); Siuli Sarkar, Bangalore (IN); Anna Lifton, Bridgewater, NJ (US); Rahul Raut, Edison, NJ (US); Bawa Singh, Voorhees, NJ (US)

(*) Notice: Subject to any disclaimer, the term of this patent is extended or adjusted under 35 U.S.C. 154(b) by 0 days.

(21) Appl. No.: 14/077,995

(22) Filed: Nov. 12, 2013

(65) Prior Publication Data

US 2014/0060703 A1    Mar. 6, 2014

Related U.S. Application Data

(63) Continuation-in-part of application No. 12/497,065, filed on Jul. 2, 2009, which is a continuation of application No. PCT/US2007/081037, filed on Oct. 11, 2007.

(60) Provisional application No. 60/942,950, filed on Jun. 8, 2007, provisional application No. 60/883,404, filed on Jan. 4, 2007.

(51) Int. Cl.
| | |
|---|---|
| *B23K 35/362* | (2006.01) |
| *B23K 35/36* | (2006.01) |
| *B23K 35/02* | (2006.01) |
| *C08K 11/00* | (2006.01) |
| *H05K 3/34* | (2006.01) |

(52) U.S. Cl.
CPC ......... *B23K 35/362* (2013.01); *B23K 35/0244* (2013.01); *B23K 35/3612* (2013.01); *B23K 35/3613* (2013.01); *B23K 2201/42* (2013.01); *C08K 11/00* (2013.01); *H05K 3/3489* (2013.01)

(58) Field of Classification Search
None
See application file for complete search history.

(56) References Cited

U.S. PATENT DOCUMENTS

| | | | | |
|---|---|---|---|---|
| 2,880,126 | A * | 3/1959 | Jordan et al. | 148/23 |
| 4,563,224 | A * | 1/1986 | Gen et al. | 148/23 |
| 4,809,901 | A | 3/1989 | Gen et al. | |
| 4,994,119 | A | 2/1991 | Gutierrez et al. | |
| 5,064,482 | A | 11/1991 | Goobich et al. | |
| 5,167,729 | A * | 12/1992 | Takemoto et al. | 148/23 |
| 5,498,297 | A * | 3/1996 | O'Neill et al. | 136/246 |
| 5,820,697 | A | 10/1998 | Hamilton et al. | |
| 5,985,456 | A * | 11/1999 | Zhou et al. | 428/414 |
| 6,650,022 | B1 * | 11/2003 | Qi et al. | 257/797 |
| 2002/0017337 | A1 * | 2/2002 | Arora et al. | 148/25 |
| 2003/0053784 | A1 | 3/2003 | LaBrake et al. | |
| 2006/0054210 | A1 | 3/2006 | Proisy et al. | |
| 2010/0139952 | A1 | 6/2010 | Arora et al. | |

FOREIGN PATENT DOCUMENTS

| | | |
|---|---|---|
| CN | 1555497 A | 12/2004 |
| DE | 19711350 A1 | 10/1997 |
| EP | 0225465 A1 | 6/1987 |
| GB | 662697 A | 12/1951 |
| JP | 05-291732 A | 11/1993 |
| JP | 2006-296072 A | 10/2006 |

OTHER PUBLICATIONS

Techni-tool (date unknown).*
Pfluke, Karl. "Soldering Photovoltaic Cells." Techni-tool. No date.

* cited by examiner

*Primary Examiner* — Melvin C Mayes
*Assistant Examiner* — Stefanie Cohen
(74) *Attorney, Agent, or Firm* — Carmody Torrance Sandak & Hennessey LLP

(57) ABSTRACT

Flux formulations that remain pliable and tack-free after deposition are disclosed. In certain examples, the flux comprises a first component and an effective amount of a second component to provide a pliable flux after deposition. The flux may also include activators, plasticizers, surface active agents and other components.

14 Claims, No Drawings

FLUX FORMULATIONS

CROSS-REFERENCE TO RELATED APPLICATIONS

This application is a continuation-in-part application of U.S. patent application Ser. No. 12/497,065 filed on Jul. 2, 2009, which is a continuation application of PCT Application Ser. No. PCT/US2007/081037 filed on Oct. 11, 2007, which claims the benefit of U.S. Provisional Patent Application Ser. Nos. 60/883,404 filed on Jan. 4, 2007 and 60/942,950 filed on Jun. 8, 2007, the entire contents of each of which are hereby incorporated herein by reference in their entireties for all purposes.

FIELD OF THE TECHNOLOGY

Embodiments of the technology disclosed herein relate generally to fluxes. More particularly, embodiments of the technology disclosed herein relate to fluxes that remain pliable and tack-free after coating and drying.

BACKGROUND

It is the nature of soldering processes that a flux is necessary for the solder material to wet to a substrate. The flux reacts with and thereby removes oxide surface layers on both the solder and the substrates. This ensures that clean metals are presented during reflow so wetting and associated intermetallic formation can proceed.

Fluxes are generally provided as liquids that can be painted, sprayed or otherwise dispensed onto the metallic surfaces prior to reflow. Also, such liquid fluxes can be used to pre-coat metal surfaces. In this case, the flux is deposited onto the metal and dried prior to use. This approach is often adopted for pre-forms.

SUMMARY

In accordance with a first aspect, a flux comprising a first component and an effective amount of a second component to provide pliability after deposition is provided. In some examples, the flux may also be adherent. In certain examples, the flux may comprise a third component that is effective to reduce, deter or prevent formation of unwanted chemical species on a surface of the component to which the flux is to be added. In other examples, the flux may comprise a fourth component that is effective to soften or render the flux flexible prior to or after deposition on a desired surface. Illustrative compounds for the first, second, third and fourth components are discussed in more detail below. In certain examples, the flux may contain other components to provide a desired physical or chemical property to the flux. In some examples, the amounts of the first, second, third or fourth component may be selected to control the tackiness of the flux. In certain examples, the amount of the third component or the fourth component may be selected to induce a desired degree of curing for tack-free and transparent flux.

In accordance with another aspect, a rosin flux comprising an activated rosin and an effective amount of a polymeric component to render the rosin flux pliable after deposition is disclosed. In certain examples, the polymeric component may be mixed or combined with a resin or a rosin to provide the flux. In other examples, an activator, softener, plasticizer or the like may also be added to the activated rosin component, and optionally the resin or rosin, to provide the flux.

In some examples, reactive diluent may be added to provide a thermally or UV curable resilient flux formulation.

In accordance with another aspect, a part pre-coated with a flux is provided. In certain examples, the flux coated on the part may comprise an effective amount of an activated rosin and polymeric components to render the flux highly active and pliable after deposition on a surface. In other examples, the flux coated on the part comprises a first component and an effective amount of a second component to provide a pliable flux after the flux has been coated and dried. In certain examples, the flux coated on the part may also comprise additional components to provide a desired physical or chemical property to the flux.

In accordance with an additional aspect, a kit comprising a flux and instructions for using the flux is provided. In certain examples, the flux of the kit comprises an effective amount of an activated rosin adduct and polymeric components to render the flux pliable and active after deposition on a surface.

In other examples, the flux comprises a first component and an effective amount of a second component to provide a pliable flux after the flux has been coated and dried. In some examples, the kit may also include one or more parts to be coated with the flux. In certain examples, the kit may also include a solder for use with the flux.

In accordance with another aspect, an electrical component comprising an effective amount of a pliable flux deposited on the electrical component is disclosed. In some examples, the flux comprises an effective amount of an activated rosin adduct and polymeric components to render the flux pliable after deposition on a surface of the electrical component. In certain examples, the flux comprises a first component and a second component present in an effective amount to provide an active and pliable flux after the flux has been coated and dried. In some examples, the flux deposited on the electrical component may also comprise additional components to provide a desired physical or chemical property to the flux.

In accordance with an additional aspect, a method of producing a pre-form is disclosed. In certain examples, the method comprises depositing a pliable flux on a surface of a part. In other examples, the method may also include drying the deposited flux. In additional examples, hot melting and/or solvent drying processes may be used. In some examples, the method may further include packaging the pre-form. Additional steps that may be used in producing a pre-form are discussed in more detail below.

In accordance with another aspect, a method of facilitating production of a flux coated part comprising providing a pliable flux and instructions for using the pliable flux with a part, such as an electrical or mechanical component, is provided. In certain examples, the method may further include providing a solder for use with the pliable flux and a part, such as an electrical or mechanical component.

In accordance with an additional aspect, a flux comprising a resin, an effective amount of activated rosin adduct and oligomeric or polymeric components to provide pliability to the flux after deposition of the flux, an activator, and a surface active agent is disclosed. Illustrative resins, oligomeric/polymeric components, activators and surface active agent are described herein.

In accordance with another aspect, a flux comprising an activated rosin adduct, an effective amount of a polymeric component to provide pliability to the flux after deposition of the flux, an activator, and a plasticizer is provided. Illustrative resins, polymeric components, activators and plasticizers are disclosed herein.

In accordance with an additional aspect, a flux comprising a resin, an effective amount of an activated rosin adduct and reactive diluent to provide pliability to the flux after deposition of the flux, an activator and a plasticizer is disclosed. Illustrative rosin adducts, reactive diluent, activators and plasticizers are described herein.

In accordance with another aspect, a flux comprising an activated rosin adduct, rosin ester, an effective amount of a polymeric component, an activator, and surface active agent is provided. Illustrative activated rosins adduct, rosin ester, polymeric component, activators and surface active agent are described herein.

In accordance with an additional aspect, a flux comprising an activated resin, an oligomeric component, an activator, and an effective amount of a plasticizer to render the flux soft prior to or after deposition on the surface is disclosed. Illustrative rosins, polymeric components, activators and plasticizers are described herein.

In accordance with another aspect, a flux comprising an activated resin, a polymeric component, an activator, and an effective amount of a plasticizer to render the flux soft prior to or after deposition on a surface is provided. Illustrative rosins, polymeric components, activators and plasticizers are described herein.

In accordance with an additional aspect, a flux comprising a resin, a polymeric component, an activator, and an effective amount of a plasticizer to provide tack to the tacky flux is disclosed. Illustrative resins, polymeric components, activators and plasticizers are described herein.

In accordance with an additional aspect, an adherent flux comprising a resin, a polymeric component, wherein the resin and the polymeric component are each present in an effective amount to provide an adherent flux, an activator, and a plasticizer is disclosed. Illustrative resins, polymeric components, activators and plasticizers are disclosed herein.

In accordance with another aspect, an adherent flux comprising a rosin, a polymeric component, wherein the rosin and the polymeric component are each present in an effective amount to provide an adherent flux, an activator, and a plasticizer is provided. Illustrative rosins, polymeric components, activators and plasticizers are disclosed herein.

In accordance with another aspect, a flux comprising an activated rosin adduct, an oligomeric or polymeric component, an activator, and an effective amount of a plasticizer to provide tack to the tacky flux is provided. Illustrative activated rosins, polymeric components, activators and plasticizers are disclosed herein.

In accordance with an additional aspect, a thermally curable flux comprising an activated rosin adduct, a reactive diluent, to provide thermally curable flux, an effective amount of an activator, and a plasticizer is disclosed. Illustrative activated rosin adducts, reactive diluents, activators and plasticizers are described herein.

In accordance with an additional aspect, a thermally curable flux comprising an activated rosin adduct, a polymeric component, a reactive diluent, to provide thermally curable flux, an effective amount of an activator, and a surface active agent is disclosed. Illustrative activated rosin adducts, polymeric components, reactive diluents, activators and surface active agent are described herein.

In accordance with another aspect, a photosensitive flux comprising an activated rosin adduct, a reactive diluent, an effective amount of an activator and photosensitive component to provide photosensitive flux is provided. Illustrative rosins adducts, reactive diluents, activators, photosensitive components and plasticizers are disclosed herein.

In accordance with another aspect, a photosensitive flux comprising an activated rosin adduct, a polymeric component, a reactive diluent, an effective amount of an activator and photosensitive component to provide photosensitivity and plasticizer is provided. Illustrative rosins adducts, polymeric component, reactive diluents, activators, photosensitive components and plasticizers are disclosed herein.

Additional features and aspects are discussed in more detail below. Other advantages, novel features and objects of the invention will become apparent from the following detailed description of the invention.

DETAILED DESCRIPTION

One issue with many fluxes is that the deposited flux, when dried, is friable. In shipping and handling of the coated product, flux can be abraded or cracked off. This can result in degradation of wetting during the soldering process. Embodiments of the flux formulations disclosed herein overcome at least some of these and other drawbacks of existing flux coatings. Processing protocols are also disclosed herein.

In accordance with certain examples, the fluxes disclosed herein may be used in a soldering operation to assemble an electrical component, such as a printed circuit board, a mechanical component, such as copper pipe used in plumbing applications or other components that may need to be joined. In certain examples, the flux may be used in the assembly of semiconductor components, photovoltaic systems such as solar panels and the like.

In accordance with certain examples, embodiments of the fluxes disclosed herein may be pliable and adhere to a desired surface. In some examples, the pliable flux may be tacky, whereas in other examples the pliable flux may be non-tacky. Tackiness of the flux may be assessed, for example, using IPC-TM-650 Method 2.4.44 dated March 1998. The degree to which the flux is tacky may be controlled be selecting suitable amounts of the components in the flux. More particularly, the degree of tackiness of the flux may advantageously be controlled based on the amounts of the third and fourth components, as discussed in more detail below. In examples where the flux is minimally adherent or not adherent, an adhesive may be used to retain the flux on a desired surface.

In accordance with certain embodiments, a flux comprising a first component and an effective amount of a second component to provide a pliable flux after the flux has been coated and dried is provided. As used herein, the term "pliable" or "pliability" refers to a flux that can bend (or be bent), deform or the like easily without breaking or cracking. Pliability also refers to the flexibility and adherence of a flux layer deposited on a base material. Pliability may be evaluated using similar methods to those of adherence, e.g., ASTM 1676-03 dated 2003.

In certain examples, the first component may be a resin. In some examples, the resin may be acidic, neutral or basic. In some embodiments, the resin may be a naturally occurring resin or may be a synthetic resin. Combinations of natural and synthetic resins may also be used. Illustrative resins for use in the fluxes disclosed herein include, but are not limited to, phenolic resins, thermosetting resins, thermoplastic resins and the like. Examples of other resins that may be used include, but are not limited to, TACOLYN 1065 resin dispersion, TACOLYN 1070 resin and FORAL 85-55WKX resin (each of which is also available from Hercules, Inc., Wilmington, Del., USA). Shellac (naturally occurring gum lac), synthetic and naturally occurring waxes may also be used alone or in combination with other materials. Additional suitable resins will be readily selected by the person of ordinary skill in the art, given the benefit of this disclosure.

In other embodiments, the first component of the flux may be a rosin. By themselves, most rosins are brittle and friable. When modified or combined with a suitable amount of a second component of the fluxes disclosed herein, the overall flux formulation is pliable when dried. In some examples, the rosin may be acidic, neutral or basic. In some embodiments, the rosin may be a naturally occurring resin or may be a synthetic rosin. In some examples, rosin may be activated by forming high softening point adducts. Combinations of natural and synthetic rosins may also be used. Illustrative rosins include, but are not limited to, an unmodified rosin such as, for example, a gum rosin, a tall oil rosin, or a wood rosin, or a modified or altered rosin such as a hydrogenated rosin, a disproportionated rosin, a rosin ester, or rosin-modified resin. Combinations of modified and unmodified rosins may also be used. Other suitable resins include, for example, acid or anhydride adducts of rosins. Activated rosins may provide additional activity to the flux.

In certain examples, the second component of the fluxes disclosed herein is typically selected to provide a flux that is pliable and/or highly adhered after drying, e.g., passes ASTM Tape Test D3359-02 dated 2002. In certain examples, the second component may be selected from oligomers, polymers, resins, amides, amines, reactive diluents and mixtures thereof. In certain examples, an oligomer or polymer that exhibits an acceptable high level of post-coating ductility may be used in the base carrier. In certain examples, the polymer may be selected from any one or more of the following: polyamide resins (e.g., Versamid products supplied by Cognis Corp. IL USA), Uni-Rez products supplied by Arizona Chemical, FL, USA), acrylic resins (e.g., Paraloid resin supplied by Rohm & Haas, Elvacite acrylic resins supplied by Dupont), and ethylene acrylic co-polymers (e.g., AC-5120 supplied by Allied Signal, Nucryl supplied by DuPont). In some examples, polymerized rosin and oligomers may be selected from any one or more of the following: suppliers: Eastman company, (Dymerex and Poly-Pale series products), Arakawa Chemicals Inc., Hercules Inc., etc. In some examples, a mixture of a polyamide, an acrylic, an ethylene acrylic co-polymer and higher homologues thereof may be used as the second component. Additional suitable materials for use as the second component of the fluxes disclosed herein will be readily selected by the person of ordinary skill in the art, given the benefit of this disclosure.

In accordance with certain examples, the exact weight percentage of the first component and the second component may be variable provided that a pliable flux is produced. It may be desirable to alter the amount of the first component based on the amount and properties of the second component used in the flux formulation. Similarly, the amount of the second component may be altered based on the amount of first component that is present. In certain examples, about 5 weight percent to about 99 weight percent of the first component, more particularly about 15 weight percent to about 95 weight percent, of the first component is present in the flux formulation. As discussed herein, the second component of the flux formulation is present in an effective amount to provide a pliable flux. In certain examples, the amount of the second component may vary from about 1 weight percent to about 80 weight percent, more particularly about 5 weight percent to about 50 weight percent, e.g., about 15 weight percent to about 35 weight percent. The first component is typically selected in a suitable amount to provide adherence, pliability, and/or flux activity. The amount of the second component may be greater or less than these illustrative ranges depending on the properties of the other components present in the flux.

In certain examples, the flux may comprise a third component that is effective to reduce, deter or prevent formation of unwanted chemical species on a surface of the component to which the flux is to be added. In certain examples, the third component may be, or may include, an antioxidant or an activator. In examples where the third component is an antioxidant, the antioxidant is present in an effective amount to reduce, deter or prevent formation of oxides on the surface where the flux is deposited. Illustrative antioxidants include, but are not limited to, amines, phenols, condensation products of aldehydes and amines, chromates, nitrites, phosphates, hydrazine, and ascorbic acid.

In examples where the third component is an activator, the activator may be one or more compounds that fall into the general class of compounds that are carboxylic acids, sulfonic acids, phosphonic acids, phosphate esters, amino acids, alkanolamines, halide bearing compounds, and combinations thereof. Illustrative activators suitable for use in the fluxes disclosed herein include, but are not limited to, carboxylic acids (adipic, fumaric, maleic, malonic, glutaric succinic acid, para-tertiary-butylbenzoic acid, trimellitic acid, trimesic acid, hemimellitic acid, etc.) ionic halides, amine hydrohalides (dimethylamine hydrohalide, cyclohexylamine hydrohalide, diethylamine hydrohalide etc), non-ionic halides (styrene dibromide, dibromobutenediol, etc), long chain fatty acids (palmitic, myristic, stearic acid etc), amines (guanidine, triisopropanolamine, alkyleneamines etc), ammonium salts such as fluoroborate and bromide, surfactants, lipids, fats, waxes and the like. In other examples one or more monocarboxylic acids, dicarboxylic acids or polycarboxylic acids may be used as an activator. Other suitable activators include, but are not limited to, ketocarboxylic acids, levulinic acid, sulfonic acids, benzenesulfonic acid, toluenesulfonic acid, phosphonic acids, phosphonoacetic acid, 1-hydroxyethylidene-1,1-diphosphonic acid and phenyl phosphonic acid. Esters such as phosphate esters, monophosphate esters, diphosphate esters based on aliphatic alcohols, aliphatic ethoxylated alcohols, aromatic alcohols or aromatic ethoxylated alcohols may also be used as activators. In some examples one or more amino acids may be used as an activator. Illustrative other compounds that may be used as activators include, but are not limited to, glycine, aminobutyric acid, aminovaleric acid, alkanolamines, triisopropanolamine, triethanolamine, non-ionic halide compounds or organic halides such as trans-2, 3-dibromo-2-butene-1,4-diol, meso-2,3-dibromosuccinic acid, 5-bromosalicylic acid, 3,5-dibromosalicylic acid, water-soluble mono and dibromo compounds, and halide free water soluble compounds. Additional compounds suitable for use as activators will be readily selected by the person of ordinary skill in the art, given the benefit of this disclosure.

In certain examples, the flux may include one or more activators which may take the form of a supporting activator package. In certain examples, a supporting activator package includes one or more activators appropriate to the solder material to be used with the flux. In certain examples, the activator package may also include a substrate to be soldered and the electrochemical/corrosion requirements of the application being served.

In accordance with certain examples, the amount of third component used in the flux may vary. In certain examples, the third component is present from about 0 weight percent to about 30 weight percent, more particularly about 0 weight percent to about 20 weight percent, e.g., about 0 weight percent to about 10 weight percent, based on the total weight of the flux. The amount of the third component is typically selected to provide for pliability and activity.

In certain examples, a fourth component may be, or may include, one or more plasticizers. The exact plasticizer used depends, at least in part, on the compounds selected for the first, second and third components. In certain examples, a suitable plasticizer may be selected such that the overall flux is soft or rendered softer than a flux without the plasticizer. Illustrative general classes of plasticizers suitable for use in the fluxes disclosed herein include, but are not limited to, phthalate-based plasticizers, adipate-based plasticizers, trimellitates, maleates, sebacates, benzoates, epoxidized vegetable oils, sulfonamides, organophosphates, glycols, polyethers and various ethylene oxide-propylene oxide (EO/PO) copolymers. Illustrative specific plasticizers suitable for use in the fluxes disclosed herein include, but are not limited to, tetrahydrofurfurylalcohol, bis(2-ethylhexyl) phthalate (DEHP), diisononyl phthalate (DINP), bis(n-butyl)phthalate (DnBP, DBP), butyl benzyl phthalate (BBzP), diisodecyl phthalate (DIDP), di-n-octyl phthalate (DOP or DnOP), diethyl phthalate (DEP), diisobutyl phthalate (DIBP), di-n-hexyl phthalate, dimethyl adipate (DMAD), monomethyl adipate (MMAD), dioctyl adipate (DOA), trimethyl trimellitate (TMTM), tri-(2-ethylhexyl) trimellitate (TEHTM-MG), tri-(n-octyl,n-decyl) trimellitate (ATM), tri-(heptyl, nonyl) trimellitate (LTM), n-octyl trimellitate (OTM), dibutyl maleate (DBM), diisobutyl maleate (DIBM), dibutyl sebacate (DBS), N-ethyl toluene sulfonamide (ortho and para isomers), N-(2-hydroxypropyl) benzene sulfonamide (HP BSA), N-(n-butyl) benzene sulfonamide (BBSA-NBBS), tricresyl phosphate (TCP), tributyl phosphate (TBP), triethylene glycol dihexanoate (3G6, 3GH), tetraethylene glycol diheptanoate (4G7), nitrobenzene, carbon disulfide and P-naphthyl salicylate, triethyl citrate (TEC), acetyl triethyl citrate (ATEC), tributyl citrate (TBC) acetyl tributyl citrate (ATBC), trioctyl citrate (TOC), acetyl trioctyl citrate (ATOC), trihexyl citrate (THC), acetyl trihexyl citrate (ATHC), butyryl trihexyl citrate (BTHC, trihexyl o-butyryl citrate), trimethyl citrate (TMC), nitroglycerine (NG), butanetriol trinitrate (BTTN), metriol trinitrate (METN), diethylene glycol dinitrate (DEGN), bis(2,2-dinitropropyl)formal (BDNPF), bis(2,2-dinitropropyl)acetal (BDNPA), 2,2,2-Trinitroethyl 2-nitroxyethyl ether (TNEN), sulfonated naphthalene formaldehyde based 15 materials, sulfonated melamine formaldehyde based materials, and polycarboxylic ethers, dioctyl terephthalate 2,5-dimethyl-2,5 hexanediol (DOTP). Additional suitable plasticizers will be readily selected by the person of ordinary skill in the art, given the benefit of this disclosure.

In certain examples, reactive diluents may be used along with either rosin based or rosin free activators. Such formulations may be thermally cured to achieve the pliable flux. Examples of reactive diluents may include but not restricted to: 1,6-hexanediol diglycidyl ether, allyl glycidyl ether, normal-butylglycidyl ether, polypropyleneglycol diglycidyl ether, tridecyl glycidyl ether, Bisphenol-A diglycidyl ether based resin, Bisphenol-A diglycidyl ether based resin, methylene dianiline tetraglycidyl ether, tris hydroxyphenyl methane triglycidyl ether, 1,4-butanediol diglycidyl ether, 1,6-hexanediol diglycidyl ether, polypropyleneglycol diglycidyl ether, trimethylolpropane triglycidyl ether, catro oil glycidyl ester etc. Additional activators include: Malkyd resin, maleated rosin, amine derivatized rosin, Methylene dianiline activator, triethylenetetramine, Ancamine™, Methylene dianiline adduct, organic anhydride activator, Norbornene type anhydride activator, Diamino diphenyl sulfone activator, BF3-amine accelerator, polyamines, polyamides, imidazole based activator etc.

In certain examples, a pliable flux coating may be achieved with a photosensitive component along with reactive diluents. Examples of photosensitizers may include but are not limited to: benzophenone, acetophenone, benzin and benzoin compounds, thixanthones, quinone derivatives, Irgacure 184, Irgacure 127, Irgacure 1700, Irgacure 2559, Ciba Darocure® 1173, and chemcure series photoinitiators.

Formulations may vary and photosensitive components are preferably present in an effective amount to achieve a cured pliable flux. Illustrative amounts include, but are not limited to, 0 weight percent to about 15 weight percent, more particularly, about 0 weight percent to about 10 weight percent, e.g., about 0 weight percent to about 5 weight percent.

In certain examples, the exact amount of fourth component used in the flux formulations may vary and preferably is present in an effective amount to soften the flux as compared to a flux that does not include the fourth component. Illustrative amounts include, but are not limited to, 0 weight percent to about 15 weight percent, more particularly, about 0 weight percent to about 10 weight percent, e.g., about 0 weight percent to about 5 weight percent. The amount of the fourth component is typically selected to provide for pliability.

In certain examples, the flux may contain other components to provide a desired physical or chemical property to the flux. For example, the flux may include a temperature indicator to provide visual feedback that the flux has exceeded a certain temperature. Illustrative temperature indicators include, but are not limited to, Irgalite bordeaux (Ciba Geigy (Tarrytown, N.Y.)), Acid Red (Sigma-Aldrich (St. Louis, Mo.)), and Irgalite Red NBSP (Ciba Geigy). Additional suitable materials for use as temperature indicators will be readily selected by the person of ordinary skill in the art, given the benefit of this disclosure.

In certain examples, the flux may include a dye or colorant to impart a desired color to the flux. In some examples, the flux may be colored coded to provide indicia (e.g., the source of the flux is Fry's Metals), the composition of the flux (e.g., leaded flux, lead free flux, halide free flux, etc.), or to provide an indicator of what type of solder should be used with the flux. In some examples, the flux may be color coded for a particular application. For example, flux suitable for use in printed circuit board applications may be blue, flux suitable for use in copper plumbing applications may be red, and flux suitable for brazing applications may be yellow.

In certain embodiments, pliable fluxes may all be color coded with a first color to distinguish such fluxes from conventional non-pliable fluxes. It will be within the ability of the person of ordinary skill in the art, given the benefit of this disclosure, to select suitable colorants for use in the fluxes disclosed herein.

In some examples, the colorant may be UV-sensitive or absorb UV light such that it may be observed by exposing the colorant to a UV light source. Illustrative UV-sensitive colorants include, but are not limited to, Blankophor SOL (Bayer), Optiblanc SPL-10 (3 V Inc.) and Tinopal SFP (Ciba). The exact amount of UV-sensitive colorant used may vary, and illustrative amounts include, but are not limited to, about 0.0005% by weight to about 1% by weight.

In accordance with certain examples, the flux may also contain other agents to impart a desired property to the flux.

For example, viscosity modifiers, surfactants, thixotropic agents and the like may be added to the flux to provide a desired consistency or property to facilitate easier handling or deposition of the flux on a desired surface. Illustrative viscosity modifiers include, but are not limited to, glycerol, glycols, stabilite, alkyl glycidyl ethers, ethyl cellulose, hydroxypropyl cellulose, butyl methacrylate, and feldspar.

In some examples, the viscosity modifier may be a polymer that has a molecular weight of at least about 25,000 g/mol, more particularly, at least about 50,000 g/mol. Illustrative thixotropic agents include, but are not limited to, clays, gels, sols, waxes, polyamides, oxidized poly ethyenes, polyamide/polyethylene mixtures, and the like.

In certain examples, surface wetting may be promoted by the addition of one or more anionic surfactants or other surface-active agents. Examples of suitable surface-active agents include fluorinated surfactants, siloxane or silane modified surface active agents as well as nonionic, cationic and amphoteric surfactants. In practice, the surfactant is generally present in a concentration of less than 2.0%, by weight, of the flux.

In certain examples, the surfactant concentration may be not more than 1.0%, by weight, of the flux. The concentration of the surfactant may be selected to enable the flux to wet thoroughly the surfaces to be soldered, while not contributing substantially to the level of flux residues that will be left behind after soldering. Nonionic, cationic and amphoteric surfactants can also be used. Illustrative surfactants include, but are not limited to, Zonyl FSN Fluorosurfactant (described as a perfluoroalkyl ethoxylate) available from E. I. DuPont de Nemours & Co., Inc., Fluorad FC-430 (described as a fluoroaliphatic polymeric ester) available from the Industrial Chemical Products Division of 3M, and ATSURF fluorosurfactants available from Imperial Chemical Industries. Other illustrative surfactants include, but are not limited to, alkoxysilanes (polyalkyleneoxide modified heptamethyltrisiloxane), ethers (allyloxypolyethyleneglycol methyl ether, polyoxyethylenecetyl ether), polydimethylsiloxane, polyether modified polydimethylsiloxane, polyester modified polydimethylsiloxane, hexadimethyl silane, hexadimethyldisilazane,. polyoxyethylenesorbitan monooleate, water-soluble ethylene oxide adducts of an ethylene glycol base, water-soluble ethylene oxide-propylene oxide adducts of a propylene glycol base, a polycarboxylic acid (a dicarboxylic acid having at least 3 carbon atoms), a dimerized carboxylic acid, a polymerized carboxylic acid, and the like.

In accordance with certain examples, the flux may also include minor amounts of other components, such as biocides, fillers, dyes, foaming agents, de-foaming agents and stabilizers. The exact amount of these other agents used may vary and is typically less than about 1% to 2% by weight of the flux.

In accordance with certain examples, the flux may take various forms including a liquid, a paste, a solid or may take other forms. In certain examples, the flux may be packaged such that the flux may be deposited by brushing, coating, spraying, spray coating, dipping, rolling or other methods.

In other examples, the flux may be packaged in a pen type device such that application of the flux may be accomplished by contacting the pen tip with a surface. In some examples, the pen type device may include a heated tip such that the flux can be melted prior to contacting a surface. In certain examples, the flux may be loaded into a device similar to a glue gun, and after heating, may be deposited on a desired surface. It will be within the ability of the person or ordinary skill in the art, given the benefit of this disclosure, to select suitable methods for depositing the fluxes disclosed herein.

In accordance with certain examples, the fluxes disclosed herein may be used with many different components where two or more joints are connected. Illustrative applications include plumbing applications, brazing applications, and soldering applications. In a particular application, the fluxes may be used with electrical components and electrical conductors including, but not limited to, photovoltaic wires, photovoltaic ribbons, and interconnects of printed circuit boards.

In certain examples, the flux may be used with components that include two or more materials. For example, the flux may be used with a wire that has been co-extruded and includes a first material on the inside and a second material on the outside. In other examples, the fluxes may be used with alloys, laminates, composite materials and other components that include two or more materials. In certain examples, the fluxes disclosed herein may also be used at joints in sheet-metal objects such as food cans, roof flashing, drain gutters and automobile radiators. In some examples, the fluxes disclosed herein may be used in a soldering operation to assemble jewelry and small mechanical parts. For examples, the fluxes may be used in soldering to join lead came and copper foil in stained glass work. Additional applications are discussed in more detail below.

In accordance with certain examples, the fluxes disclosed herein may be used as a protective coating. For example, a mechanical or electrical component may be coated with a flux to prevent oxidation of the surface of the component. The flux may be removed prior to use of the component or may be left on the component in the case where the flux does not interfere with the intended function of the component.

In accordance with certain examples, the fluxes disclosed herein may be deposited in layers. In certain examples, layers of two or more different types of flux may be deposited. For example, it may be desirable to deposit a non-water soluble flux on a water soluble flux to protect the water soluble flux from a humid environment. The exact amount of each layer may vary from about 0.01% by weight to about 10% by weight based on the overall weight of the part the flux is deposited on, more particularly about 0.1% by weight to about 5% by weight. The total amount of the layers of flux may vary from about 0.2% by weight to about 4% by weight, though the amount selected may be more or less to provide a thinner or thicker total thickness depending on the intended application of the flux. In examples where the flux is deposited in a thin layer, e.g., about 200 microns or less, the flux layer may be transparent and may be used, for example, as a protective coating on a surface. It will be recognized by the person of ordinary skill in the art, given the benefit of this disclosure, that more or less flux may be required depending on the nature of the surfaces to be coupled or joined. For example, where the material is minimally susceptible or not susceptible to oxidation, a molecular layer or several molecular layers of flux may be deposited on the surface, e.g., in a vacuum or the like.

In accordance with certain examples, a flux film is provided. In certain examples, the flux film may be produced by depositing flux to a desired thickness on a backing or a carrier. After drying, the film may be peeled or removed from the backing or carrier and deposited onto a desired surface. In one application, the film may be laminated to a surface to form a composite. For example, the flux film may be laminated to a printed circuit board. In certain examples, the flux film may be photoimaged to create a flux pattern. An electrical component may be placed at a desired area on the patterned flux and then soldered.

In accordance with certain examples, the fluxes disclosed herein may be used with many different types of electrical and mechanical components. In certain examples and in a soldering process used to produce a printed circuit board, leads of electrical components, e.g., gold or gold-coated leads, may be passed through holes in the board and placed in contact with conductive contacts on the other side of the board, and/or lead less chip components are mounted on the bottom side of the board with an adhesive. The pliable flux may then be applied to the board by spray or wave methods. The flux may be applied so as to coat the surface of the board, to remove oxides and/or prevent cleaned metallic surfaces from re-oxidation. During pre-heat, the fluid component of the flux may be evaporated or otherwise removed, and during soldering, the first component and optionally the second component may change phase of properties, e.g., melt or change viscosity. For example, the rosin or resin may form a hard, non-tacky, hydrophobic resinous layer. Such thermal processing may provide high surface insulation resistance, which promotes the reliability of electrically conductive solder connections.

In accordance with certain examples, the fluxes disclosed herein may be used with drawn wire. Drawn wire may be produced using conventional wire drawing methods. For example, a metal may be heated and pulled or pushed through a die. The pulled wire may be wound around a drum. In continuous-wire drawing configurations, a series of dies through which the wire passes in a continuous manner may be used. Problems of feeding between each die is solved by using a block between each die, so that as the wire issues it coils around the block and is aided to the next die. The speeds of the blocks may be increased successively, so that the elongation due to drawing is taken up and any slip is taken into account. The drawn wire may be covered with a coating or an insulator, such as rubber, plastic or the like. The drawn wire may be solid or may be stranded. A selected portion or surface of the wire may be pre-coated with one or more of the fluxes disclosed herein. Alternatively, the fluxes disclosed herein may be selected for use with a drawn wire by an end-user. In some examples, the drawn wire may be pre-coated and bent to a desired shape.

In accordance with certain examples, flux combined with additional materials to form a mixture prior to or after deposition on a selected surface. Suitable additional materials include, but are not limited to, metals and metal alloys, ceramics, powders, fillers, particles, binders, solder alloys and the like. In some examples, the additional materials may be mixed into the flux and the mixture may then be deposited on a surface. In certain examples, the flux coating may be deposited and then impregnated with such additional materials.

In accordance with certain examples, the flux may be loaded into a carrier which may be used to facilitate transfer of the flux to a desired surface. For example, the flux may be loaded into a carrier in the form of strips, e.g. similar to tape, and the entire strip may be wrapped around a joint prior to soldering. Other carrier vehicles include, but are not limited to, a scrim, a web, a mesh, a polymer network and the like.

In accordance with certain examples, the fluxes disclosed herein may be used with solder preforms. The solder preforms may take various shapes including, but not limited to, washers, sleeves, collars, and rectangles. Additional suitable shapes and configurations for solder preforms will be readily selected by the person of ordinary skill in the art, given the benefit of this disclosure.

In accordance with certain examples, the fluxes disclosed herein may be used to join two or more metal pipes. For example, copper pipes commonly used in delivering potable water may be joined using the fluxes disclosed herein along with a suitable solder, e.g., a lead-free solder such as a silver-based solder. In certain examples, the copper pipe may be pre-coated on a selected portion, e.g., at each end, so that flux does not need to be added by an end-user prior to soldering. In other examples, the entire outside surface of the copper pipe may be pre-coated with a flux so that if the pipe is cut at a desired location, the end of the pipe to be soldered still contains flux. In other examples, the flux may be coated on the pipe by an end-user prior to soldering. It will be within the ability of the person of ordinary skill in the art, given the benefit of this disclosure, to use the fluxes disclosed herein to join metal pipes.

In accordance with certain examples, the pliable nature of the fluxes disclosed herein renders them useful with parts having non-circular cross sections. For example, most wire is cylindrical in form and has a circular cross-section. The circular cross-section lacks discontinuous surfaces. In contrast, parts having rectangular, triangular or other non-circular cross section may have sharp angles. Traditional fluxes have not proved useful when used on parts having a non-circular cross-section due to the brittle nature of the flux resulting in flaking off and cracking. The pliable nature of the fluxes disclosed herein allows them to be coated and used with parts having a non-circular cross section without any substantial flaking off or cracking of the flux at the corners of the part. When using the flux with non-circular shape components, it may be possible to increase the amount of flux used as the surface area of the non-circular component may be larger as compared to the surface area of a circular component. The flux may be coated on the entire part or may be coated on a portion of the part. It will be recognized by the person of ordinary skill in the art, given the benefit of this disclosure, that other shapes, such as star shapes, ribbon shapes, saw tooth shapes and the like, may also be used with the fluxes disclosed herein. Such additional shapes will be readily selected by the person of ordinary skill in the art, given the benefit of this disclosure.

In certain examples, the fluxes may be used as a binder for solder powders that may subsequently be pressed to form a final shape. The final shape would be used as a preform of solder. This is akin to powder metallurgy or ceramic pressing processes used in making complex net shapes.

In accordance with certain examples, the fluxes disclosed herein may be used to coat powder. This result may be achieved by variants of physical vapor deposition such as a fluidized bed, as well as immersion techniques. Such powder is ideally suited for enhanced solder paste formulations. Such powder may also be impregnated with other materials, such as those materials commonly used in powder metallurgy. It will be within the ability of the person of ordinary skill in the art, given the benefit of this disclosure, to select suitable techniques to coat powder using the fluxes disclosed herein.

In accordance with other examples, the fluxes disclosed herein may take various shapes. For example, the fluxes may be used in the form of spheres, e.g., as a protective coating for spheres of a ball grid array. The fluxes may be used as thin films having a constant or variable thickness at different portions of the thin film. The fluxes may be used in the form of strips or pieces that can be wrapped around a joint prior to soldering. Such strips may optionally include an adhesive or the like to retain, at least temporarily, the solder strip in place. In certain examples, the flux may take a suitable form to prevent or reduce oxidation by FRET corrosion, e.g., corrosion from two surfaces rubbing together.

In accordance with certain examples, the flux may also be used in the production of numerous different electrical components including, but not limited to, televisions, cellular phones, printers, automotive electronics, aeronautic electronics, medical electronics, photovoltaic cells, military electronics, electrical conductors for heaters (rear window defrosters), flexible circuits and other electrical devices where it may be desirable to connect two or more components.

In accordance with certain examples, the fluxes disclosed herein may be prepared using many different suitable methods. In one example, the first component and the second component are combined and melted. In certain examples, the second component may be melted prior to addition of the first component. The third and fourth component, and optionally additional components, may then be added to the mixture of the first and second components. In applications where the flux is to take a liquid form, the various components may be added to a solvent, solvent mixture or solvent system to disperse or dissolve the various components. Agitation, shaking, blending, vortexing, heating and the like may be used to increase the rate at which the various components are mixed and/or dissolved in a selected solvent, solvent mixture or cosolvent system.

In accordance with certain examples, a method of producing flux films is disclosed. In certain examples, the method comprises disposing or otherwise depositing a flux on a substrate or a mold. Subsequent to deposition, the film of flux may be removed from the substrate to provide a stand-alone flux film. In certain examples, films of metals covered with flux may be produced. The metal films may be deposited using suitable techniques such as, for example, vapor deposition techniques. In other examples, wires of flux containing metallic powders and alloys may be produced. The metallic powders and alloys may be mixed with the flux prior to deposition or may be sprayed or co-sprayed by a stream to mix the flux and metallic powders and alloys in situ. Suitable techniques for producing flux films, either alone or with metals or alloys will be recognized by the person of ordinary skill in the art, given the benefit of this disclosure.

In certain examples, the flux films may be photoimaged. In some examples, flux films including one or more metal fillers may be photoimaged. In certain examples, a flux film comprising a variable amount of tackiness is provided. In some examples, only a portion of the flux film is tacky and adherent such that the adherent portion may be placed or stuck to a desired surface. In other examples, a flux film where a single side of the flux film is tacky is provided. In some examples, both sides of a flux film may be tacky. In certain examples, at least some portion, but not all, of each side of a flux film may be tacky. In some examples, solder performs that are tacky on at least some portion or all of one side but not tacky on the other side may be produced using the fluxes disclosed herein.

In accordance with certain examples, embodiments of the fluxes disclosed herein may be mixed with one or more binders, e.g., powders, fillers and the like. In certain examples, a binder may be mixed with the flux in an effective amount such that when the flux is compacted under pressure, the binder is effective to bind the flux. In some examples, the binder may also be selected to function as a release agent, e.g., as a mold release to reduce or prevent sticking to a die. Suitable binders include, but are not limited to, polyvinyl alcohols, poly(vinyl pyrrolidone), celluloses (methyl cellulose, hydroxypropyl methyl cellulose and other similar species), fatty acids and their derivatives (metal salts and polymers of fatty acids), and natural and synthetic waxes.

In accordance with certain examples, the components of the flux may be configured to impart a desired solubility in a selected solvent. In certain examples, the flux formulation disclosed herein may be soluble in alcohols such as isopropanol or in organic solvents such as methylene chloride, chloroform, ethyl acetate, hexane or mixtures thereof. Additionally, hydrophobic solvents like diethyl ether, toluene, isopar or mixtures thereof may be used. A solution of such a flux at various solids contents can be used to dip, spray, brush, vapor or otherwise coat a solder material. Embodiments of the fluxes disclosed herein provide high adherence. The flux coating may be applied to pre-form precursor material, e.g., strip material can be pre-coated before pre-forms are stamped. For many pre-form geometries, this result is an enormous benefit in coated pre-form production. In certain embodiments, the flux is desirably insoluble in other cleaning solvents used in the pre-form production process. For certain configurations of the flux, the flux may be insoluble in selected solvents to facilitate suspension but not dissolution of the flux in such selected solvents.

Certain specific formulations are discussed in more detail below to illustrate further some of the many features and aspects of the technology disclosed herein. The various components used in the examples may be obtained from numerous different sources. For example, derivative rosins are commercially available from Eastman Company, Kingsport, Tenn. (Foral AX, Dymerex, and Poly-Pale™) and Pine chemicals China (Rosin acid/anhydride adduct). Versamid 940 and Versamid 750 are commercially available from Cognis (Cincinnati, Ohio). WW Gum Resin is commercially available from PDM (Wilmington, Del.). Arakawa KE-604, KR-610, and Malkyd series are commercially available from Arakawa Chemical (Japan). AC-5120 resin is commercially available from Honeywell (Morristown, N.J.). Adipic acid is commercially available from Pfizer Chemical (New York, N.Y.). Suberic acid is commercially available from Aldrich Chemical (St. Louis, Mo.). Cyclohexylamine HCl is commercially available from Ubichem (UK). Polypropyleneglycol diglycidyl ether and trimethylolpropane triglycidyl ether are commercially available from Aldrich Chemicals (USA). Surface active agents are available from BYK Inc. (Wallingford Calif.). Irgacure and Ciba series photosensitizers are available from BASF (Port Arthur Tex.).

The embodiments described herein will be further illustrated through the following examples which are illustrative in nature and not intended to limit the scope of the disclosure.

EXAMPLE 1

A pliable, non-tacky flux was prepared by combining rosin anhydride adduct (maleated rosin), polymerized rosin (Dymerex), Arakawa KR-604 (or Arakawa KR-612), adipic acid and suberic acid. The process used to prepare the flux was as follows: The amount or resin and/or rosin was weighed and added to a clean mixing tank equipped with a heating jacket. The mixture was heated slowly to 130-140° C. to avoid overheating the components. When about half of the resin melted, mixing was initiated. The resins were melted completely at 130-140° C. The desired amount of organic acid was weighed out and added to the mixing tank until all of the solids were dissolved. The desired amount of plasticizer (when present) was weighed out and added to the mixing tank, and the mixture was mixed for about 10 minutes. The resulting mixture was transferred to a storage container or used to coat metal ribbon or wire. Solidified flux may be re-melted prior to use. The solid flux may also be dissolved in a suitable solvent such that the flux may be sprayed to coat pre-forms, solder powder, solder foil (to stamp preforms), composite metal ribbon, solid solder wire, etc. Similarly, flux may be prepared by dissolving pre-weighed ingredients in the solvent or solvent mixtures at room temperature. Flux to solvent ratio may be tuned as per the desired application.

The flux in this example included 20% by weight rosin anhydride adduct, 35% by weight polymerized rosin (Dymerex), 20% by weight Arakawa KE-604, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good as determined by passing of the bent wire test. The flux was almost tack-free as characterized by IPC-TM-650 Method 2.4.44 dated March 1998.

EXAMPLE 2

A pliable flux was prepared as described in Example 1 by combining rosin anhydride, polymerized rosin (Dymerex), Foral AX, adipic acid and suberic acid. The flux included 55% by weight polymerized rosin (Dymerex), 10% by weight rosin anhydride adduct and Foral AX each, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was tack-free as characterized by IPC-TM-650 Method 2.4.44 dated March 1998.

EXAMPLE 3

A pliable flux was prepared as described in Example 1 by combining rosin ester, polymerized rosin (Dymerex), Arakawa KE 604, adipic acid, and suberic acid. The flux included 20% by weight rosin ester, 35% by weight Dymerex, 20 wt % by weight Arakawa KE604, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was non-tacky as characterized by IPC-TM-650 Method 2.4.44 dated March 1998.

EXAMPLE 4

A pliable flux was prepared as described in Example 1 by combining rosin anhydride, partially dimerized rosin (Poly-Pale), Foral AX, adipic acid, and suberic acid. The flux included 10% by weight rosin anhydride, 55% by weight Poly-Pale, 10% by weight Foral AX, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was non-tacky as characterized by IPC-TM-650 Method 2.4.44 dated March 1998.

EXAMPLE 5

A pliable flux was prepared as described in Example 1 by combining rosin anhydride, partially dimerized rosin (Poly-Pale), versamid 940, adipic acid, and suberic acid. The flux included 20% by weight rosin anhydride, 50% by weight polymerized rosin (Dymerex), 5% by weight versamid, 20 wt % by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was non-tacky as characterized by IPC-TM-650 Method 2.4.44 dated March 1998.

EXAMPLE 6

A pliable flux was prepared as described in Example 1 by combining rosin anhydride, polymerized rosin (Dymerex), Foral AX E, Versamid 940, adipic acid, and suberic acid. The flux included 20% by weight rosin anhydride, 30% by weight polymerized rosin (Dymerex), 10% by weight Foral AX E, 15% by weight Versamid, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was little tacky as characterized by IPC-TM-650 Method 2.4.44 dated March 1998.

EXAMPLE 7

A pliable flux was prepared as described in Example 1 by combining Versamid 940, polymerized rosin (Dymerex), adipic acid, and suberic acid. The flux included 53% by weight Versamid 940, 22% by weight polymerized rosin (Dymerex), 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was non-tacky as characterized by IPC-TM-650 Method 2.4.44 dated March 1998.

EXAMPLE 8

A pliable flux was prepared as described in Example 1 by combining rosin anhydride, partially dimerized rosin (Poly-Pale), BYK 310, adipic acid, and suberic acid The flux included 20% by weight rosin anhydride, 50% by weight partially dimerized rosin (Poly-Pale), 0.1% by weight BYK310, 24.9% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was non-tacky as characterized by IPC-TM-650 Method 2.4.44 dated March 1998.

EXAMPLE 9

A pliable flux was prepared as described in Example 1 by combining Versamid 940, KE604, partially dimerized rosin (Poly-Pale), BYK 310, adipic acid, and suberic. The flux included 8.7% by weight versamid, 15.71% by weight KE604, 42.14% by weight partially dimerized rosin (Poly-Pale), 1.43% by weight BYK310, 26% by weight adipic acid and 6.02% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was non-tacky as characterized by IPC-TM-650 Method 2.4.44 dated March 1998.

EXAMPLE 10

A pliable flux was prepared as described in Example 1 by combining mildly activated rosin anhydride adduct, polypropyleneglycol diglycidyl ether, adipic acid and suberic acid. 50% by weight rosin anhydride adduct, 25% by weight polypropyleneglycol diglycidyl ether, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was tacky as characterized by IPC-TM-650 Method 2.4.44 dated March 1998.

EXAMPLE 11

A pliable flux was prepared as described in Example 1 by combining mildly activated rosin anhydride adduct, polymerized rosin (Dymerex), polypropyleneglycol diglycidyl ether, adipic acid and suberic acid. 35% by weight polymerized rosin (Dymerex), 20% by weight rosin anhydride adduct, 10% by weight polypropyleneglycol diglycidyl ether, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was tacky as characterized by IPC-TM-650 Method 2.4.44 dated March 1998.

EXAMPLE 12

A pliable flux was prepared as described in Example 1 by combining mildly activated rosin anhydride adduct, trimethylolpropane triglycidyl ether, adipic acid and suberic acid. 60% by weight rosin anhydride adduct, 20% by weight polypropyleneglycol diglycidyl ether, 15% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was tacky as characterized by IPC-TM-650 Method 2.4.44 dated March 1998.

EXAMPLE 13

A pliable flux was prepared as described in Example 1 by combining mildly activated rosin anhydride adduct, polymerized rosin (Dymerex), trimethylolpropane triglycidyl ether, adipic acid and suberic acid. 35% by weight polymerized rosin (Dymerex), 30% by weight rosin anhydride adduct, 10% by weight trimethylolpropane triglycidyl ether, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was tacky as characterized by IPC-TM-650 Method 2.4.44 dated March 1998.

EXAMPLE 14

A pliable UV curable flux was prepared as described in Example 1 by combining mildly activated rosin anhydride adduct, polypropyleneglycol diglycidyl ether, Irgacure 184 (or Ciba Darocure® 1173), adipic acid and suberic acid. 48% by weight rosin anhydride adduct, 24% by weight polypropyleneglycol diglycidyl ether, 3% by weight Ciba Darocure® 1173, 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was tacky as characterized by IPC-TM-650 Method 2.4.44 dated March 1998.

EXAMPLE 15

A pliable UV curable flux was prepared as described in Example 1 by combining mildly activated rosin anhydride adduct, polymerized rosin (Polymerized rosin (Dymerex)), trimethylolpropane triglycidyl ether, Irgacure 184 (or Ciba Darocure® 1173), adipic acid and suberic acid. 30% by weight Polymerized rosin (Dymerex), 30% by weight rosin anhydride adduct, 10% by weight trimethylolpropane triglycidyl ether, 5% by weight Irgacure 184 (or Ciba Darocure® 1173), 20% by weight adipic acid and 5% by weight suberic acid.

Resiliency of the flux was tested by bending wire beyond a 360° angle and by twisting wire beyond 360° and inspecting for cracks, delamination and adhesion. The resiliency and adherence of the flux in this example was good. The flux was tacky as characterized by IPC-TM-650 Method 2.4.44 dated March 1998.

EXAMPLE 16

Example 1 was repeated except that the malkyd resin was used in lieu of rosin-anhydride adduct. Flux was tack-free as per IPC-TM-650 testing method 2.4.44 dated March 1998.

EXAMPLE 17

Example 2 was repeated except that the malkyd resin was used in lieu of rosin-anhydride adduct. Flux was tack-free as per IPC-TM-650 testing method 2.4.44 dated March 1998.

EXAMPLE 18

Example 9 was repeated except that the poly (vinyl pyrrolidone) K30 was used in lieu of BYK310. Flux was tack-free as per IPC-TM-650 testing method 2.4.44 dated March 1998.

EXAMPLE 19

Example 9 was repeated except that the BYK4510 was used in lieu of BYK310. Flux was tack-free as per IPC-TM-650 testing method 2.4.44 dated March 1998.

EXAMPLE 20

Example 9 was repeated except that the BYK307 was used in lieu of BYK310. Flux was tack-free as per IPC-TM-650 testing method 2.4.44 dated March 1998.

EXAMPLE 21

Example 18 was repeated except that the amount of poly (vinyl pyrrolidone) K30 was increased to 5% by weight. Adipic acid amount was decreased accordingly. Flux was tack-free as per IPC-TM-650 testing method 2.4.44 dated March 1998.

It is to be appreciated that embodiments of the compositions and methods discussed herein are not limited in application to the details of construction and the arrangement of components set forth in the description. Various aspects are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the compositions and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to direction or relative position are intended for convenience of description, not to limit the present compositions, devices and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description is by way of example only, and the scope of the disclosure should be determined from proper construction of the appended claims, and their equivalents.

What is claimed is:

1. A photovoltaic ribbon pre-coated with a pliable flux, the flux comprising:
    a) a first component, wherein the first component comprises an activated rosin adduct or a rosin ether;
    b) an effective amount of a second component to provide pliability to the flux, wherein the second component comprises an oligomeric or polymeric component;
    c) a third component present in an effective amount to reduce formation of chemical species on a substrate; and
    d) a fourth component is a plasticizer; wherein the plasticizer is selected from the group consisting of phthalate-based plasticizers, adipate-based plasticizers, trimellitates, maleates, sebacates, benzoates, epoxidized vegetable oils, sulfonamides, organophosphates, glycols, polyethers and ethylene oxide-propylene oxide (EO/PO) copolymers.

2. The photovoltaic ribbon of claim 1, wherein the second component comprises a polyamide, an acrylic, an ethylene acrylic co-polymer, or a mixture thereof.

3. The photovoltaic ribbon of claim 1, in which the third component is an activator.

4. The photovoltaic ribbon of claim 1, wherein the fourth component is present in an effective amount to render the flux soft prior to or after deposition on the substrate.

5. The photovoltaic ribbon of claim 1, in which an amount of the first component and an amount of the second component are independently selected to provide an adherent flux.

6. The photovoltaic ribbon of claim 1, wherein the flux further comprises one or more of a reactive diluent, a colorant, a photosensitive material, a binder, and a surface active agent.

7. The photovoltaic ribbon of claim 1, wherein the flux is substantially tack-free upon drying.

8. An electrical component pre-coated with a pliable flux, the flux comprising:
    a) a first component, wherein the first component comprises an activated rosin adduct or a rosin ether;
    b) an effective amount of a second component to provide pliability to the flux, wherein the second component comprises an oligomeric or polymeric component;
    c) a third component present in an effective amount to reduce formation of chemical species on a substrate; and
    d) a fourth component is a plasticizer; wherein the plasticizer is selected from the group consisting of phthalate-based plasticizers, adipate-based plasticizers, trimellitates, maleates, sebacates, benzoates, epoxidized vegetable oils, sulfonamides, organophosphates, glycols, polyethers and ethylene oxide-propylene oxide (EO/PO) copolymers.

9. The electrical component of claim 8, wherein the second component comprises a polyamide, an acrylic, an ethylene acrylic co-polymer, or a mixture thereof.

10. The electrical component of claim 8, wherein the fourth component is present in an effective amount to render the flux soft prior to or after deposition on the substrate.

11. The electrical component of claim 8, wherein the flux further comprises one or more of a reactive diluent, a colorant, a photosensitive material, a binder, and a surface active agent.

12. The electrical component of claim 8, wherein the flux is substantially tack-free upon drying.

13. The electrical component of claim 8, in which an amount of the first component and an amount of the second component are independently selected to provide an adherent flux.

14. The photovoltaic ribbon of claim 3, wherein the activator is a carboxylic acid, sulfonic acid, phosphonic acid, phosphate ester, amino acid, alkanolamine, halide bearing compound, and combinations thereof.

* * * * *